United States Patent
Beck et al.

(10) Patent No.: US 9,645,192 B2
(45) Date of Patent: May 9, 2017

(54) GROUND FAULT CIRCUIT INTERRUPTER AND METHOD

(71) Applicant: Semiconductor Components Industries, LLC, Phoenix, AZ (US)

(72) Inventors: Riley D. Beck, Eagle Mountain, UT (US); Kent D. Layton, Lehi, UT (US); Scott R. Grange, Pleasant Grove, UT (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 631 days.

(21) Appl. No.: 13/829,394

(22) Filed: Mar. 14, 2013

(65) Prior Publication Data
US 2014/0266272 A1  Sep. 18, 2014

(51) Int. Cl.
G01R 31/3187 (2006.01)
G01R 31/28 (2006.01)
H02H 3/33 (2006.01)

(52) U.S. Cl.
CPC .......... G01R 31/2827 (2013.01); H02H 3/33 (2013.01); H02H 3/335 (2013.01)

(58) Field of Classification Search
CPC ....... G01R 31/2827; H02H 3/335; H02H 3/33
USPC ..................................................... 324/750.3
See application file for complete search history.

(56) References Cited

U.S. PATENT DOCUMENTS

| 3,794,884 A | 2/1974 | Sircom |
| 3,879,639 A | 4/1975 | Sircom |
| 4,001,646 A | 1/1977 | Howell |
| 4,021,729 A | 5/1977 | Hudson, Jr. |
| 4,150,411 A | 4/1979 | Howell |
| 4,378,579 A | 3/1983 | Hudson, Jr. |
| 5,206,600 A | 4/1993 | Moehlmann |
| 5,459,630 A | 10/1995 | MacKenzie et al. |
| 5,515,001 A | 5/1996 | Vranish |
| 5,600,524 A | 2/1997 | Neiger et al. |
| 5,715,125 A | 2/1998 | Neiger et al. |
| 5,808,574 A | 9/1998 | Johnson et al. |
| 6,111,733 A | 8/2000 | Neiger et al. |
| 6,259,996 B1 | 7/2001 | Haun et al. |
| 6,421,214 B1 | 7/2002 | Packard et al. |
| 6,426,632 B1 | 7/2002 | Clunn |
| 6,618,648 B1 | 9/2003 | Shirota et al. |
| 6,674,289 B2 | 1/2004 | Macbeth |
| 6,807,035 B1 | 10/2004 | Baldwin et al. |
| 6,807,036 B2 | 10/2004 | Baldwin |
| 6,873,158 B2 | 3/2005 | Macbeth |

(Continued)

OTHER PUBLICATIONS

McEachern, Alexander, A floating-window algorithm for detecting certain power line faults that disrupt sensitive electronic loads, IEEE Trans. on Inst. and Meas., vol. 39, No. 1, Feb. 1990, pp. 112-115.

(Continued)

Primary Examiner — Thomas Valone
(74) Attorney, Agent, or Firm — Rennie William Dover

(57) ABSTRACT

A ground fault interrupter circuit and a method for operating a ground fault interrupter that includes configuring the ground fault interrupter to perform a plurality of self tests. The ground fault interrupter may be configured to perform a ground fault self test, a grounded-neutral self test, and a trip circuit self test.

21 Claims, 6 Drawing Sheets

(56) References Cited

U.S. PATENT DOCUMENTS

| | | |
|---|---|---|
| 6,946,828 B1 | 9/2005 | Layton |
| 6,980,005 B2 | 12/2005 | Finlay, Sr. et al. |
| 7,079,365 B2 | 7/2006 | Brown et al. |
| 7,154,718 B1 | 12/2006 | Finlay, Sr. |
| 7,253,629 B1 | 8/2007 | Richards et al. |
| 7,323,934 B2 | 1/2008 | Huang |
| 7,336,457 B2 | 2/2008 | Liscinsky, III |
| 7,684,162 B2 | 3/2010 | Musat et al. |
| 8,018,235 B2 | 9/2011 | Lewinski et al. |
| 8,054,593 B2 | 11/2011 | Reid et al. |
| 8,085,516 B1 | 12/2011 | Armstrong |
| 8,217,644 B2 | 7/2012 | Younsi et al. |
| 2005/0083616 A1 | 4/2005 | Reid et al. |
| 2006/0125622 A1 | 6/2006 | Baldwin et al. |
| 2007/0208520 A1* | 9/2007 | Zhang .................... H02H 3/335 702/58 |
| 2008/0022153 A1 | 1/2008 | Wang et al. |
| 2009/0251148 A1* | 10/2009 | Finlay, Sr. ............. G01R 31/14 324/424 |
| 2010/0290164 A1 | 11/2010 | Kinsel |
| 2011/0115511 A1* | 5/2011 | Finlay, Sr. ............. H01H 83/04 324/750.3 |
| 2013/0215537 A1* | 8/2013 | Beck ...................... H02H 3/162 361/42 |
| 2013/0229734 A1* | 9/2013 | Beck ...................... H02H 3/162 361/42 |

OTHER PUBLICATIONS

Russell, Don et al., A digital signal processing algorithm for detecting arcing faults on power distribution feeders, IEEE Trans. on Power Delivery, vol. 4, No. 1, Jan. 1989, pp. 132-140.

* cited by examiner

GROUND FAULT CIRCUIT INTERRUPTER AND METHOD

BACKGROUND

The present invention relates, in general, to test systems and, more particularly, to self test systems for ground fault interrupters.

Ground fault circuit interrupters are included in electrical systems to protect individuals in case a fault occurs. It is desirable to test ground fault circuit interrupters to ensure that they are functioning properly. Methods for testing these circuits have been described in U.S. Pat. No. 8,085,516 titled "Ground Fault Circuit Interrupter with Self Test" issued to Bruce G. Armstrong on Dec. 27, 2011, and U.S. Pat. No. 7,911,746 titled "GFCI with Self-Test and Remote Annunciation Capabilities" issued to Albert Zaretsky et al. on Mar. 22, 2011. Although these approaches provide self test capabilities, they do not address various types of faults that may occur.

Accordingly, it would be advantageous to have a circuit and method for performing self tests in ground fault circuit interrupters. It would be of further advantage for the circuit and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
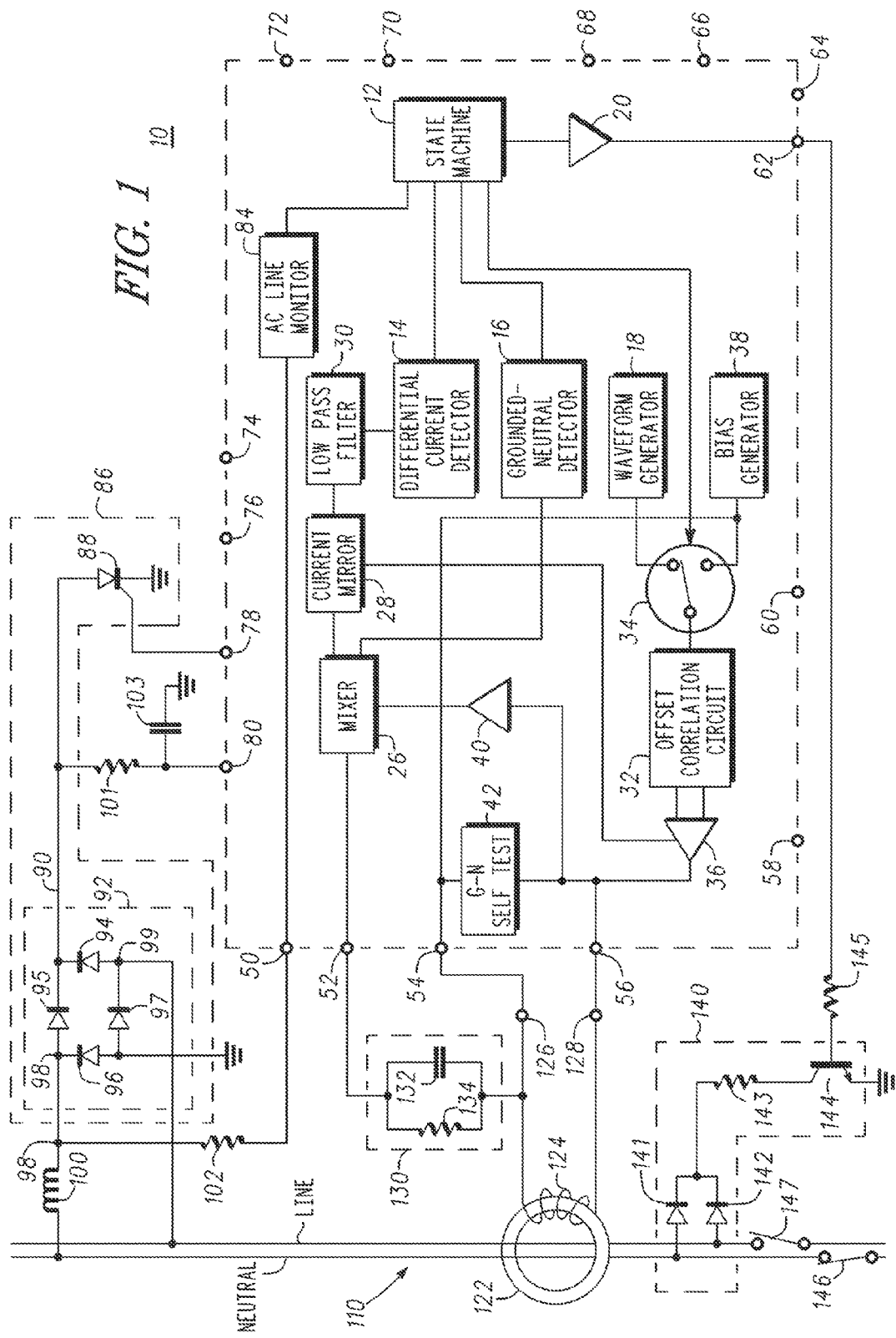
FIG. 1 is a block diagram of a ground fault circuit interrupter in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It should be noted that a logic zero voltage level ($V_L$) is also referred to as a logic low voltage or logic low voltage level and that the voltage level of a logic zero voltage is a function of the power supply voltage and the type of logic family.

DETAILED DESCRIPTION

Generally, the present invention provides a Ground Fault Circuit Interrupter (GFCI) configured for performing self tests and a method for performing self tests. In accordance with an embodiment of the present invention, a state machine is configured to perform one or more self-test functions to which one or more detectors are coupled. For example, the state machine may be configured to perform a differential or current fault self test, a grounded-neutral self test, or a trip circuit self test.

In accordance with another embodiment, a method for self testing a ground fault circuit interrupter is provided, wherein a plurality of input signals to a ground fault circuit interrupter are monitored. In response to an input signal of the plurality of input signals a differential self test is performed, in response to another input signal of the plurality of input signals a grounded-neutral self test is performed, and in response to another input signal of the plurality of input signals a trip circuit self test is performed.

FIG. 1 is a block diagram of a Ground Fault Circuit Interrupter ("GFCI") 10 in accordance with an embodiment of the present invention. By way of example, GFCI 10 is a monolithically integrated circuit formed from a semiconductor chip and has input/output terminals 50, 52, 54, 56, 58, 60, 62, 64, 66, 68, 70, 72, 74, 76, 78, and 80. It should be noted that terminals 50-80 may be input/output pins from a semiconductor component or alternatively, may represent bond pads formed on or from the semiconductor chip or the like. In accordance with an embodiment, GFCI 10 includes a state machine 12 having inputs connected to differential current detection circuitry 14 and grounded neutral detection circuitry 16 and outputs connected to a waveform generator 18 and a driver circuit 20. The differential current detection circuitry 14 is also referred to as a differential current detection circuit and the grounded neutral detection circuitry 16 is also referred to as a grounded-neutral detection circuit. GFCI 10 further includes a low pass filter 22, a current mirror 24 and a mixer or multiplier circuit 26, wherein mixer circuit 26 has an input connected to an input/output pin 62 and an output connected to an input of a current mirror 28 and to an input of grounded neutral detection circuitry 14. Current mirror 28 has an output connected to an input of differential current detection circuitry 14 through a low pass filter 30.

An AC line monitor circuit 84 is connected between input pin 50 and an input of state machine 12.

GFCI 10 further includes an offset correction circuit 32 having an input connected to a switch 34 and outputs connected to an operational transconductance amplifier (OTA) 36. It should be noted that amplifier 36 is not limited to being a transconductance amplifier, but can be an operational amplifier or the like. Switch 34 has a conduction terminal connected to the input of offset correction circuit 32, a conduction terminal connected to an output of waveform generator 18, and an input connected to a bias generator 38. Amplifier 36 has an output connected to an input of current mirror 28 and an output connected to the input of mixer 26 through a buffer 40. A grounded-neutral self test circuit 42 is connected between an output of amplifier 36 and an output of bias generator 38 that is connected to output terminal 54. More particularly, an output of amplifier 36 is connected to an input of G-N self test circuit 42 and to an input pin 56 and the output of grounded-neutral self test circuit 42 is connected to output pin 54 and an output of bias generator 38.

FIG. 1 further illustrates a Silicon Controlled Rectifier (SCR) test circuit 86 connected to GFCI 10, which is connected to a single current transformer 122. More particularly, SCR test circuit 86 comprises an SCR 88 having a terminal connected to a source of operating potential such as, for example, ground, and a terminal connected to a bridge node 90. A resistor 101 may be connected between node 90 and input/output terminal 80 and a decoupling capacitor 103 may be connected between input/output node 80 and a source of operating potential such as, for example, ground. A bridge rectifier 92 is also connected to bridge node 90, where bridge rectifier 92 comprises diodes 94, 95, 96, and 97. Diode 95 has a cathode connected to node 90 and an anode connected to a node 98, diode 96 has a cathode connected to node 98, diode 97 has an anode connected to the anode of diode 96 and for receiving a source of operating potential such as, for example, ground. Diode 94 has an anode connected to the cathode of diode 97 to form a node 99 and a cathode connected to the cathode of diode 95 at node 90. Node 98 is connected to a terminal of a solenoid 100 and to input terminal 50 through a resistor 102. The other terminal of solenoid 100 and node 99 are connected to an AC power system 110. For example, the other terminal of solenoid 100 is connected to line conductor LINE and node 99 is connected to neutral conductor NEUTRAL. Thus, solenoid 100 is connected to line conductor LINE and node 99 is connected neutral conductor NEUTRAL at a source side of AC power system 110. Alternatively, the other terminal of solenoid 100 may be connected to neutral conductor NEUTRAL and node 99 may be connected to line conductor LINE at the source side of AC power system 110.

A Resistor-Capacitor (RC) filter 130 is connected between input terminals 52 and 54. More particularly, a terminal of a capacitor 132 and a terminal of a resistor 134 are commonly connected together and to input terminal 52 and the other terminals of capacitor 132 and resistor 134 are commonly connected together and to input terminal 54.

A single current transformer 122 is associated with AC power system 110. By way of example, single current transformer 122 has a torroidal core through which line and neutral conductors LINE and NEUTRAL, respectively, pass and a secondary winding 124. Secondary winding 124 has a terminal 126 connected to output terminal 54 and a terminal 128 connected to input terminal 54.

A ground fault test circuit 140 is connected between line and neutral conductors LINE and NEUTRAL, respectively, and output terminal 62. Ground fault test circuit 140 comprises diodes 141 and 142, a resistor 143, a transistor 144, and a resistor 145. The cathodes of diodes 141 and 142 are commonly connected together and to a terminal of a resistor 143, the anode of diode 141 is connected to neutral conductor NEUTRAL, the anode of diode 142 is connected to line conductor LINE, and the other terminal of resistor 143 is connected to a current carrying terminal of transistor 144. The control terminal of transistor 144 is connected to output terminal 62 through resistor 145 and the other current carrying terminal of transistor 144 is coupled for receiving a source of operating potential such as, for example, ground. By way of example transistor 144 is a bipolar junction transistor. Ground fault test circuit 140 further includes switches 146 and 147 connected to neutral conductor NEUTRAL and line conductor LINE, respectively.

Figure 2A:
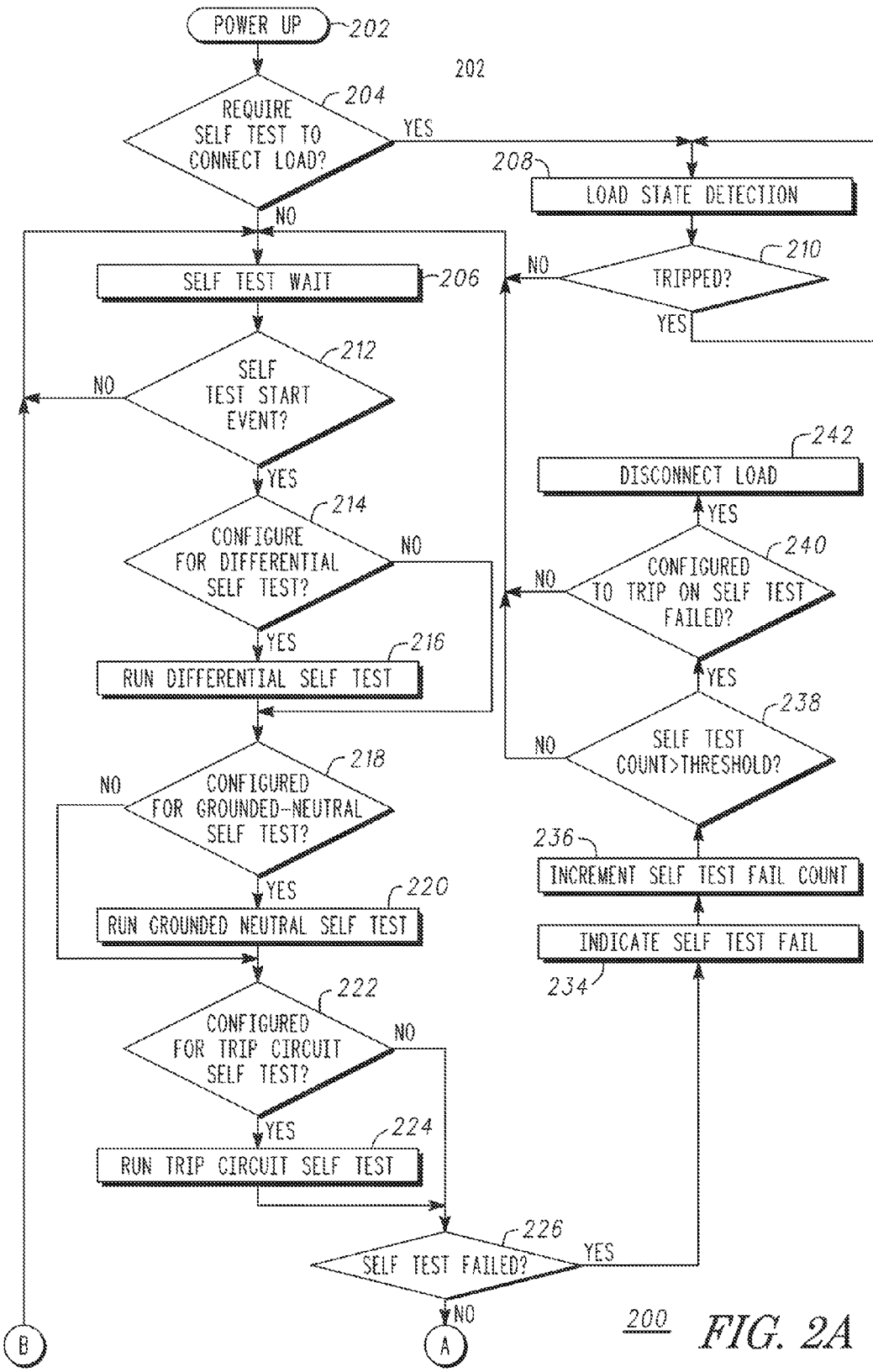
FIG. 2A is a portion of a flow diagram for self testing for faults in accordance with another embodiment of the present invention.
Figure 2B:
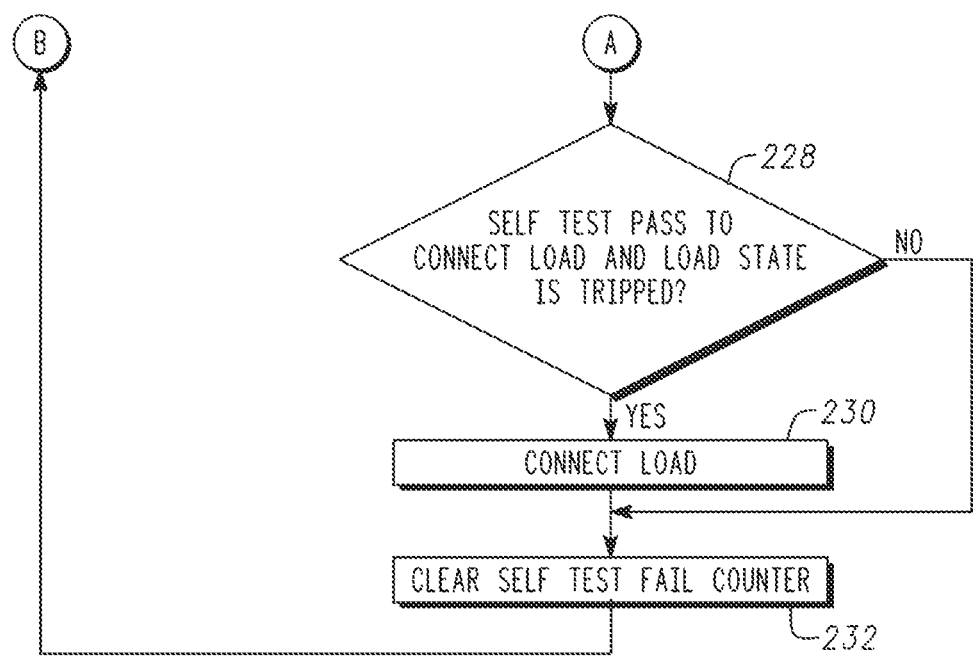
FIG. 2B is a continuation of the flow diagram of FIG. 2A for self testing for faults in accordance with an embodiment of the present invention.

In operation, state machine 12 receives input signals from differential current detector 14, ground neutral detector 16, and AC line monitor 84. In response to these input signals, state machine 12 performs one or more self tests to determine if a differential fault, grounded-neutral fault, or a trip circuit fault has occurred. Referring now to FIGS. 2A and 2B, a flow diagram 200 illustrating a method for self testing GFCI 10 is shown. It should be noted that due to size constraints, the flow diagram of FIGS. 2A and 2B have been shown on two separate drawing sheets, wherein the letters "A" and "B" have been used to denote a common connection, i.e., the circle with the "A" in FIG. 2A continues at the point with the circuit with the "A" in FIG. 2B and the circle with the "B" in FIG. 2A continues at the point with the circuit with the "B" in FIG. 2B. In response to powering up GFCI 10, state machine 12 initiates a self test indicated by box 202 and determines whether self testing is desired or not (indicated by decision diamond 204). If self testing is not desired before connecting a load to AC power system 110, state machine 12 begins a self test wait step (indicated by box 206). If self testing is desired before connecting a load to AC power system 110, state machine 12 loads the state detection information from differential current detector 14, grounded neutral detector 16, and AC line monitor 84 (indicated by box 208) and uses this information to determine whether a fault or fault trip has occurred (indicated by decision diamond 210). If a ground fault has occurred, state machine 12 loads the state detection information from differential current detector 14, grounded neutral detector 16, and AC line monitor 84 (indicated by box 208). Otherwise, a fault has not occurred and state machine enters the self test wait step (indicated by box 206).

In the absence of a self test initiation or start event, state machine 12 remains in the waiting mode. In response to a self test initiation or start event (indicated by box 212), state machine 12 determines whether GFCI 10 is configured for a differential self test (indicated by decision diamond 214). If GFCI 10 is not configured for a differential self test, state machine 12 determines whether GFCI 10 is configured for a grounded-neutral self test (indicated by decision diamond 218). Otherwise, GFCI 10 is configured for a differential self test and this test is performed (indicated by box 216).

Figure 3:
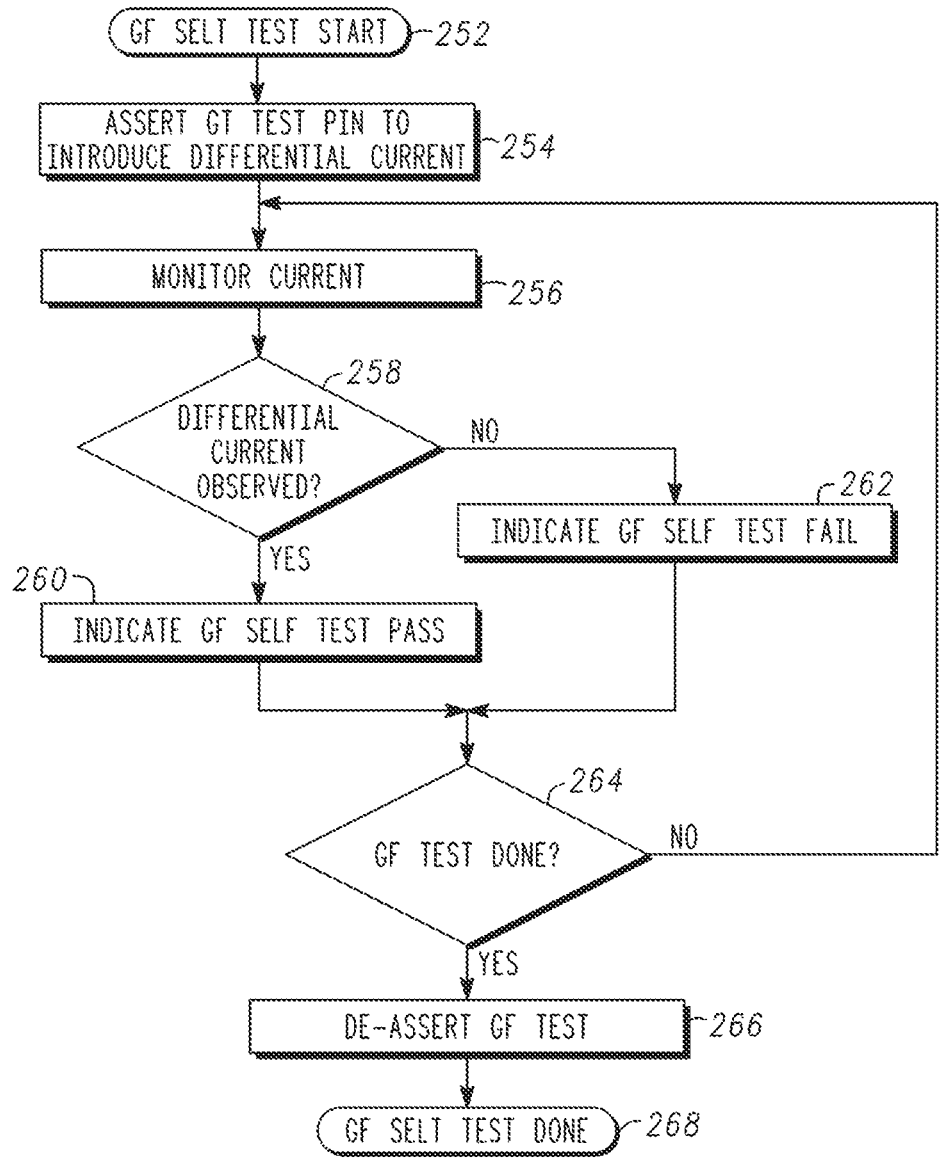
FIG. 3 is a flow diagram for self testing for differential faults in accordance with another embodiment of the present invention.

The method for performing the differential self test is described with reference to flow diagram 250 of FIG. 3. Thus, briefly referring to flow diagram 250 of FIG. 3 and in response to GFCI 10 being configured for a differential self test, a ground fault self test is initiated (indicated by oval 252). It should be noted that the current flowing through windings 124 is referred to as a differential current indicator signal because in the non-self test operating mode, it is generated in response to a differential current flowing in the line and neutral conductors LINE and NEUTRAL, respectively. It should be further noted that before initiation of the ground fault self test, GFCI 10 monitors the current flowing through windings 124 of single current transformer 122 and that state machine 12 includes a fault register in which one or more bits are set in response to the current flowing through windings 124 exceeding a threshold value or trip point $I_{TH1}$. By way of example $I_{TH1}$ is 5 milliAmperes (mA). In response to the self test initiation signal, state machine 12 applies an assertion signal at pin 126 and introduces a test current into windings 124 at a predetermined level and for a predetermined period of time (indicated by box 254) and monitors the current flowing through input/output pin 128 (indicated by box 256). For example, a test current of 8 mA is introduced into windings 124 for 8 milliseconds (msec). In response to the test current, state machine 12 determines whether a differential current indicator signal was observed (indicated by box 258), i.e., determines whether current flows through input/output pin 128. Because the test current is greater than the 5 mA trip point $I_{TH1}$, a bit in the fault register of state machine 12 is set if the test circuit is operating properly. Setting this bit indicates that GFCI 10 passed the self test, thereby indicating a pass/fail state (indicated by box 260). If state machine 12 does not detect that the bit has been set, it sends out a signal that the pass/fail state is a fail (indicated by box 262). Thus, GFCI 10 continuously monitors the current flowing through windings 124.

State machine 12 of GFCI 10 is configured to have plurality of threshold trip points. In this example, the trip points may be set at 5 mA, 20 mA, and 40 mA. The number of threshold trip points is not a limitation of the present invention. In a non self-test operation and in response to state machine 12 detecting a current greater than 5 mA and less than 20 mA for 125 msec, a first bit in the fault register is set indicating that a differential current has been detected in response to a ground fault. In response to state machine 12 detecting a current greater than 20 mA and less than 40 mA for 75 msec, a second bit in the fault register is set indicating that a differential current has been detected in response to a ground fault. In a non self-test operation and in response to state machine 12 detecting a current greater 40 mA for 25 msec, a third bit in the fault register is set indicating that a differential current has been detected in response to a ground fault. Thus, the current level of the current flowing through winding 124 by which bit of the flag register is set. An advantage of continuously monitoring the current flowing through windings 124 is that GFCI 10 monitors residual current in the system and accounts for this current in response to self testing. It should be appreciated that during the self test, GFCI 10 monitors the differential current levels for a potential ground fault by monitoring a plurality of register bits during self tests, wherein each register bit represents a different differential current, e.g., a first register bit may represent a differential current of 5 mA, a second register bit may represent a current of 20 mA, and a third register bit may represent a current of 40 mA.

Next, state machine 12 determines if the self test for the ground fault is complete (indicated by decision diamond 264). If the ground fault test is not complete, state machine 12 returns to monitoring the differential current as described with reference to box 256. If the ground fault test is complete, state machine 12 de-asserts the ground fault test signal (indicated by box 266) and the ground fault self test is complete (indicated by oval 268).

Returning to FIGS. 2A AND 2B, after the ground fault self test is complete, state machine 12 determines whether GFCI 10 is configured to perform a grounded-neutral self test (indicated by decision diamond 218). If GFCI 10 is configured to perform the grounded-neutral self test, state machine 12 runs the grounded-neutral self test (indicated by decision box 220). Otherwise state machine 12 determines whether GFCI 10 is configured to perform a tripped circuit self test (indicated by decision diamond 222).

Figure 4:
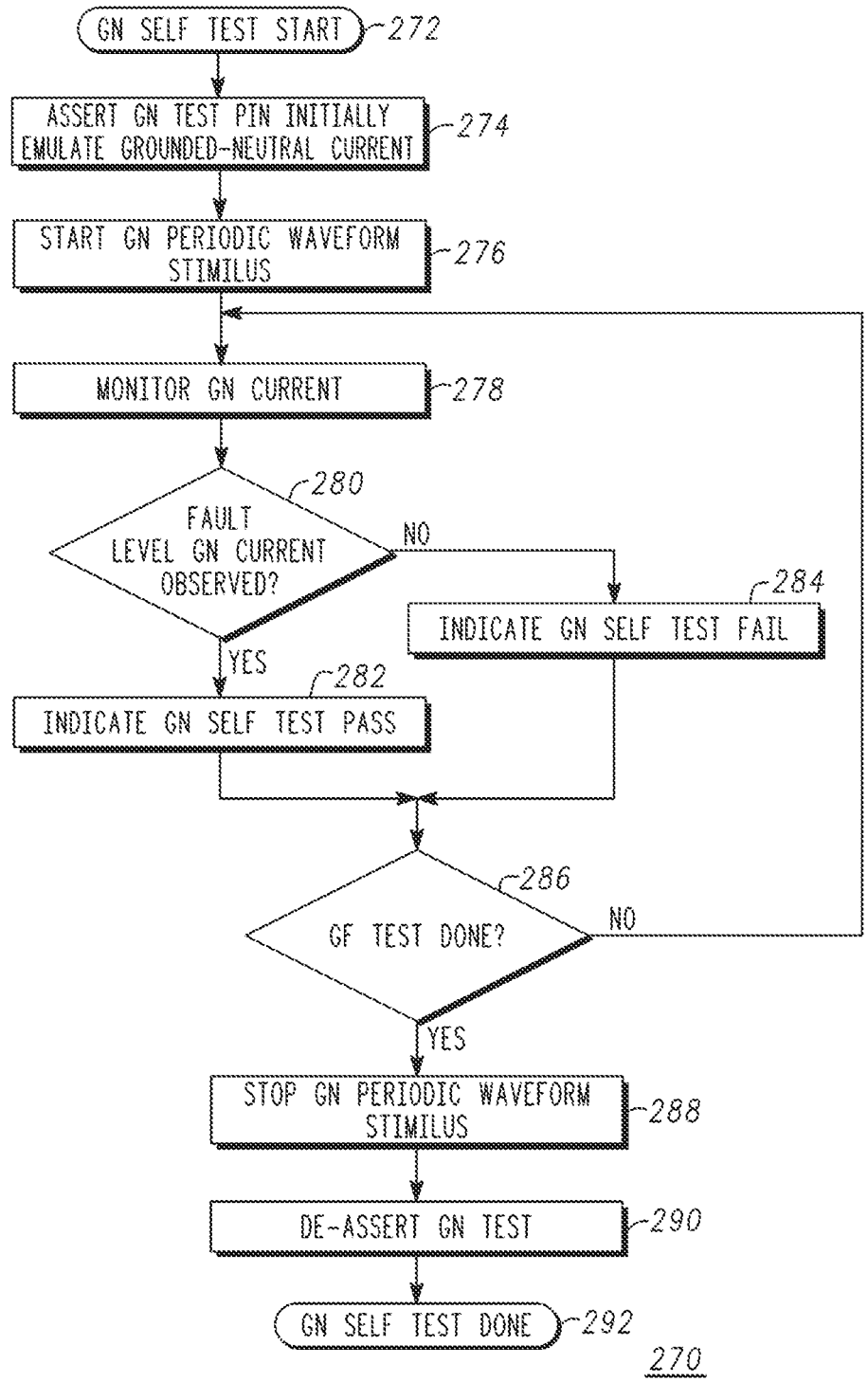
FIG. 4 is a flow diagram for self testing for grounded-neutral faults in accordance with another embodiment of the present invention.

Briefly referring to flow diagram 270 of FIG. 4, GFCI 10 is configured to run the grounded-neutral self test, which grounded-neutral self test is initiated (indicated by oval 272). State machine 12 asserts a grounded-neutral test to internally emulate a grounded-neutral current (indicated by box 274) and starts a grounded-neutral periodic waveform using waveform generator 18 shown in FIG. 1 (identified by box 276). It should be noted that the grounded-neutral periodic waveform may be a sinusoidal wave, a square wave, a sawtooth wave, or the like. GFCI 10 monitors the grounded-neutral current flowing through current transformer 124 (indicated by box 278). In response to observing a grounded-neutral current, state machine 12 issues a signal indicating that the system has passed the self test for a grounded-neutral fault, i.e., the pass/fail state is a pass (indicated by decision diamond 280 and box 282). In the absence of a grounded-neutral current, state machine 12 issues a signal indicating that the system has failed the self test for a grounded-neutral current, i.e., the pass/fail state is a fail (indicated by decision diamond 280 and box 284). Next, state machine 12 determines if the self test for the grounded-neutral fault is complete (indicated by decision diamond 286). If the grounded-neutral test is not complete, state machine 12 returns to monitoring the grounded-neutral current (described with reference to box 278). If the grounded-neutral self test is complete, state machine 12 stops waveform generator 18, i.e., stops the sine wave stimulus, and de-asserts the grounded-neutral self test signal (indicated by boxes 288 and 290). After the grounded-neutral self test is complete (indicated by oval 292), state machine 12 continues at decision diamond 222 shown in FIG. 2A.

Figure 5:
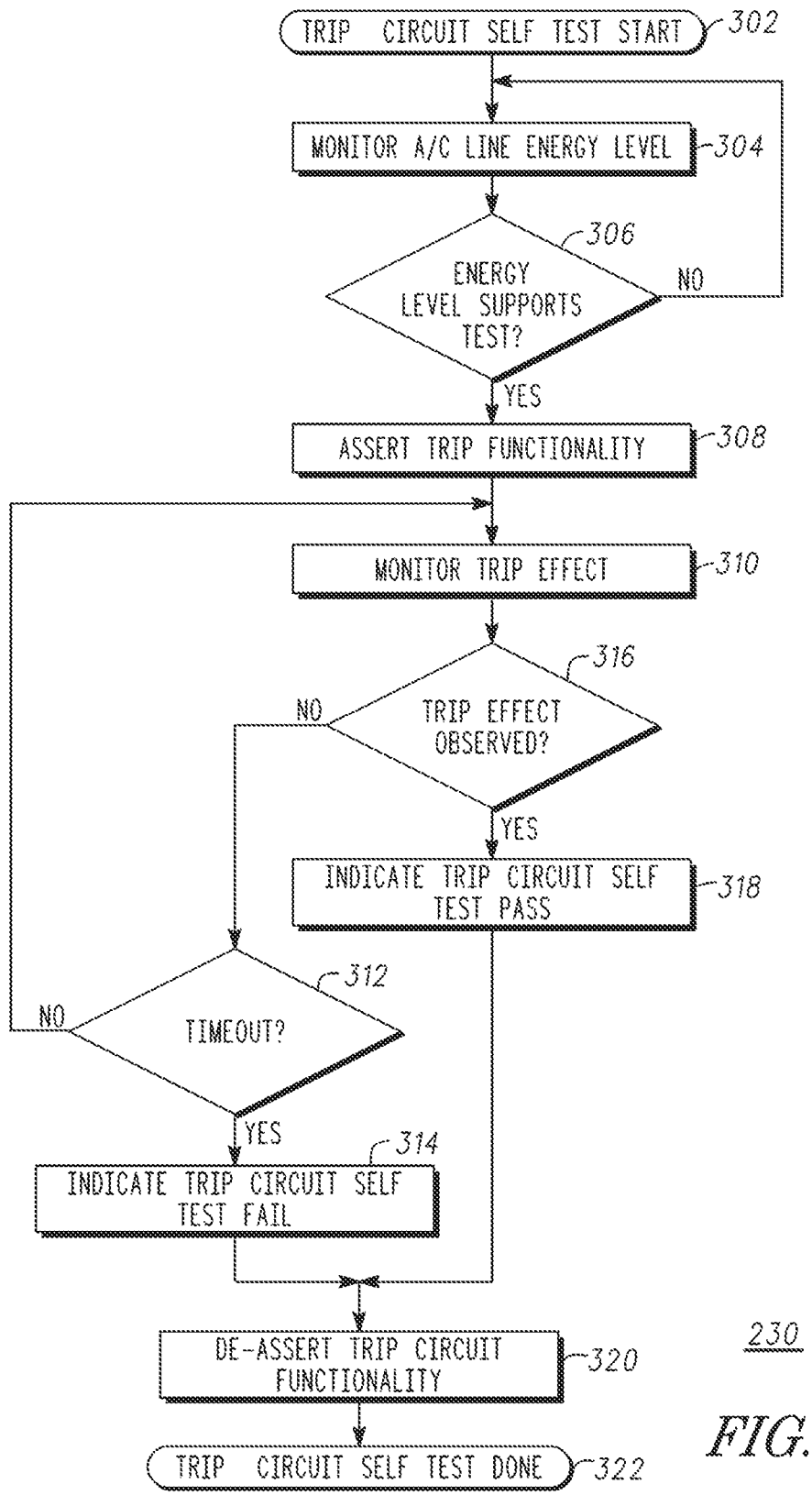
FIG. 5 is a flow diagram for self testing for tripped circuit faults in accordance with another embodiment of the present invention.

Referring again to FIG. 2A, after completing the grounded-neutral self test or, as discussed above, if GFCI 10 was not configured to perform the grounded-neutral self test, state machine 12 determines whether GFCI 10 is configured to perform the tripped circuit self test (indicated by decision diamond 222). If GFCI 10 is configured to perform the tripped circuit self test, this self test is performed (indicated by decision box 224). Briefly referring to flow diagram 300 of FIG. 5 and in response to GFCI 10 being configured to run the tripped circuit self test, a tripped circuit self test is initiated (indicated by oval 302). State machine 12 monitors the energy level of a periodic waveform using monitor 84 of FIG. 1 (indicated by box 304). If the energy level of the periodic waveform is not sufficient to support the tripped circuit self test, state machine 12 continues to monitor the energy level of the periodic waveform until it is sufficient to support the tripped circuit self test (identified by box 304 and decision diamond 306). In response to the energy level of the periodic waveform being sufficient to support the tripped circuit self test, state machine 12 asserts a trip functionality signal (identified by box 308) and monitors the trip effect (identified by box 310).

If a state machine 12 observes a trip effect, it indicates the system has passed the tripped circuit self test, i.e., the pass/fail state is a pass (identified by decision diamond 316 and box 318). If state machine 12 does not observe a trip effect, it determines whether the system has timed out (identified by decision diamonds 316 and 312). If a timeout has not occurred, state machine continues to monitor for a trip effect. (identified by decision diamond 312 and box 310). If state machine 12 determines that time out has occurred, it issues an indicator signal indicating that the system has failed the tripped circuit self test, i.e., the pass/fail state is a fail (identified by decision diamond 312 and box 314). After indicating whether the results of the tripped circuit test is a pass or fail, state machine 12 de-asserts the trip circuit functionality, the trip circuit test is complete (identified by box 320 and oval 322) and state machine 12 continues at decision diamond 226 shown in FIG. 2A.

Referring again to FIGS. 2A AND 2B, and in particular to decision diamond 226, if the system has failed the tripped circuit self test, state machine 12 decides whether passing the self tests is required to connect a load and the load state being tripped. If not, state machine 12 clears the self test fail counter (identified by box 232) and returns to waiting to start a self test described with reference to box 206. If the state machine requires connecting the load, a load is connected (indicated by decision diamond 228 and box 230). Then state machine 12 clears the self test fail counter (identified by box 232) and returns to waiting to start a self test described with reference to box 206.

If state machine 12 determines that the self test has failed at decision diamond 226, state machine 12 indicates a self test failure (identified by box 234), increments the self test fail counter (identified by box 236), and determines if the self test fail count is greater than a threshold count (identified by decision diamond 238). If the threshold has not been exceeded, state machine 12 returns to waiting to start a self test described with reference to box 206. If the threshold has been exceeded, state machine 12 determines whether it is configured to trip on a self test failure (identified by box 240). If state machine 12 is not configured to trip on a self test failure, state machine 12 returns to a waiting mode to start a self test described with reference to box 206. If the state machine 12 is configured to trip on a self test failure, state machine 12 disconnects the load (indicated by box 242) and returns to the self test wait stage indicated by box 206 of FIGS. 2A AND 2B.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A ground fault circuit interrupter having a single current transformer and self test capabilities, comprising:
   a state machine that performs one or more self-test functions; and
   one or more detectors coupled to the state machine, wherein the state machine and the one or more detectors operate in response to a signal from the single current transformer of the ground fault circuit interrupter having the single current transformer;
   a silicon controlled rectifier test circuit coupled to the state machine;
   a ground fault test circuit coupled to the state machine, wherein the ground fault test circuit interrupts current flow in the single current transformer in response to the signal from the single current transformer indicating another fault condition, and wherein the ground fault test circuit includes a first switch connected to a neutral conductor and a second switch connected to a line conductor, the ground fault circuit test circuit configured to open and close the first switch and the second switch.

2. The ground fault circuit interrupter having self test capabilities of claim 1 wherein the state machine performs a grounded-neutral self test.

3. The ground fault circuit interrupter having self test capabilities of claim 1, wherein the state machine performs a ground fault self test.

4. The ground fault circuit interrupter having self test capabilities of claim 1, wherein the state machine performs a trip circuit self test.

5. The ground fault circuit interrupter having self test capabilities of claim 1, wherein the state machine performs a ground fault self test, a grounded-neutral self test, and a trip circuit self test.

6. A method for self testing a ground fault circuit interrupter having a single current transformer, comprising:
   monitoring a plurality of input signals to the ground fault circuit interrupter in response to a current flowing through the single current transformer of the ground fault circuit interrupter;
   performing a differential self test in response to a first input signal of the plurality of input signals;
   opening a set of contacts to terminate a flow of the current through the single current transformer in response to the first input signal indicating that the ground fault circuit interrupter has failed the differential self test;
   performing a grounded-neutral self test in response to a second input signal of the plurality of input signals;
   opening a set of contacts to terminate a flow of the current through the single current transformer in response to the first input signal indicating that the ground fault circuit interrupter has failed the grounded-neutral self test;
   performing a trip circuit self test in response to a third input signal of the plurality of input signals; and
   opening a first switch or a second switch to terminate a flow of the current through the single current transformer in response to the first input signal indicating that the trip circuit interrupter has failed the trip circuit self test.

7. The method of claim 6, wherein performing the differential self test comprises using the ground fault interrupter circuit for the differential self test.

8. The method of claim 7, wherein using the ground fault interrupter circuit for the differential self test includes:
   applying an assertion signal to a first terminal of the ground fault interrupter circuit;
   monitoring a current flowing through a second terminal of the ground fault interrupter circuit;
   in response to monitoring the current flowing through the second terminal, indicating a pass/fail state.

9. The method of claim 8, wherein indicating the pass/fail state includes one of generating a pass signal in response to detecting current flowing through the second terminal or generating a fail signal in response to the absence of current flowing through the second terminal.

10. The method of claim 8, further including injecting a current through the second terminal at a level at least equal to a first current level and indicating a pass state in response to a state machine setting a register bit in response to the current being at a level at least equal to threshold level.

11. The method of claim 10, further including monitoring a plurality of register bits during self tests, wherein each register bit represents a different differential current.

12. The method of claim 6, wherein performing the grounded-neutral self test comprises using the ground fault interrupter circuit for the grounded-neutral self test.

13. The method of claim 12, wherein using the ground fault interrupter circuit for the grounded-neutral self test includes:
   initiating a grounded-neutral circuitry to internally emulate a ground-neutral current;
   initiating a stimulus having a periodic waveform;
   monitoring the grounded-neutral current at a first terminal of the ground fault interrupter circuit in response to the stimulus having the periodic waveform; and
   indicating a pass/fail state in response to monitoring the grounded-neutral current flowing through the first terminal.

14. The method of claim 13, wherein indicating the pass/fail state includes one of generating a pass signal in response to detecting the grounded-neutral current flowing through the first terminal or generating a fail signal in response to the absence of the grounded-neutral current flowing through the first terminal.

15. The method of claim 6, wherein performing the trip circuit self test comprises using the ground fault interrupter circuit for the trip circuit self test.

16. The method of claim 15, wherein using the ground fault interrupter circuit for the trip circuit self test includes:
monitoring an energy level of a periodic waveform;
asserting a first terminal in response to the energy level being greater than a first reference level;
monitoring a trip effect in response to asserting the first terminal;
indicating a pass/fail state in response to observing a trip effect.

17. The method of claim 16, wherein indicating the pass/fail state includes one of generating a pass signal in response to trip effect or generating a fail signal in response to the absence of the trip effect.

18. A method for operating a ground fault circuit interrupter having one current transformer comprising:
performing a plurality of self tests in the ground fault interrupter in response to a current signal from the one current transformer of the ground fault circuit interrupter;
opening a set of contacts to terminate a flow of a current through the one current transformer in response to one or more of the self tests indicating that the ground fault circuit interrupter has failed.

19. The method of claim 18, wherein using the ground fault circuit interrupter to perform the plurality of self tests includes using the ground fault circuit interrupter to perform a grounded-neutral self test.

20. The method of claim 18, wherein using the ground fault circuit interrupter to perform the plurality of self tests includes using the ground fault circuit interrupter to perform a ground fault self test.

21. The method of claim 18, wherein using the ground fault circuit interrupter to perform the plurality of self tests includes using the ground fault circuit interrupter to perform a trip circuit self test.

* * * * *